United States Patent [19]
Kusaka

[11] Patent Number: 5,297,333
[45] Date of Patent: Mar. 29, 1994

[54] PACKAGING METHOD FOR FLIP-CHIP TYPE SEMICONDUCTOR DEVICE

[75] Inventor: Teruo Kusaka, Tokyo, Japan

[73] Assignee: NEC Corporation, Tokyo, Japan

[21] Appl. No.: 948,688

[22] Filed: Sep. 22, 1992

[30] Foreign Application Priority Data

Sep. 24, 1991 [JP] Japan .................. 3-242249

[51] Int. Cl.⁵ ............................. B23K 31/02
[52] U.S. Cl. ...................... 29/840; 29/834; 228/179.1
[58] Field of Search ............ 29/840, 834, 833, 759; 228/179, 180.1

[56] References Cited

U.S. PATENT DOCUMENTS

| | | | |
|---|---|---|---|
| 3,387,365 | 6/1968 | Stelmak | 29/840 |
| 3,486,223 | 12/1969 | Butner | 29/840 |
| 3,811,186 | 5/1974 | Larnerd et al. | 29/840 |
| 3,859,723 | 1/1975 | Hamer et al. | 29/840 |
| 4,941,255 | 7/1990 | Bull | 29/840 |
| 5,109,269 | 4/1992 | Holzman | 29/840 |
| 5,148,968 | 9/1992 | Schmidt et al. | 228/180.2 |

FOREIGN PATENT DOCUMENTS

| | | | |
|---|---|---|---|
| 2-129991 | 5/1990 | Japan | 29/840 |
| 3-109797 | 5/1991 | Japan | 29/840 |

OTHER PUBLICATIONS

IBM Tech. Disclosure, "Solderless Assembly Method for Semiconductor Carriers", vol. 35, No. 3, Aug. 1992.
"Advance Packaging Technologies in U.S.—an Overview", IMC 1988 Proceedings, Tokyo, May 25–27, 1988, pp. 12–17, Rao R. Tummala.
"Thermal/Stress Analysis of a Multichip Package Design", Proceedings of the 39th Electronic Components Conference, May 1989, pp. 668–671.
"Thermal dry process soldering", P. A. Moskowitz, et al., J. Vac. Sci. Technol. A4(3), May/Jun. 1986, pp. 838–840.
"Passive-Silicon-Carrier Design and Characteristics", H. Schettler, IEEE 0569–5503/90/0000, pp. 559–561.
"New Film Carrier Assembly Technology: Transferred Bump TAB", Hatada et al., IEEE Transactions on Components, Hybrids, and Mfg. Tech., vol. CHMT-10, No. 3, Sep. 1987.
"Chip Alignment Templates for Multichip Module Assembly", Tewksbury et al., IEEE Transactions on Components, Hybrids, and Mfg. Techn., vol. CHMT-10, No. 1, Mar. 1987.
"Self-Aligned Controlled Collapse Chip Connect (SAC4)", Pfeiffer et al, J. Electrochem. Soc.:Solid-State Science and Technology, Nov. 1987.
"Multichip Packaging Design for VLSI-Based Systems", Bartlett et al., IEEE Transactions on Comp., Hybrids, and Mfg. Tech., vol. CHMT-10, No. 4, Dec. 1987.

*Primary Examiner*—Irene Cuda
*Attorney, Agent, or Firm*—Laff, Whitesel, Conte & Saret

[57] ABSTRACT

In a packaging method for a flip-chip type semiconductor device, the method in which the rear surface sides of a plurality of semiconductor chips having solder bump electrodes on their front surfaces are fixed temporarily with an adhesive to the respective predetermined locations on the flat surface of a block, the block and a circuit board are positioned by placing the flat surface of the block opposed to the front surface of the circuit board where pads are formed, the solder bump electrodes and the pads are brought into contact by bringing them close to each other without the intermediary of soldering flux, and the plurality of semiconductor chips are bonded in a lump to the circuit board by welding the solder bump electrodes to the pads through reflowing of the solder of the solder bump electrodes by subjecting them to heat treatment.

9 Claims, 8 Drawing Sheets

|  | Cl⁻ | Na⁺ |
|---|---|---|
| SOLDER FLUX PRODUCED BY A COMPANY | 20 | 9 |
| SOLDER FLUX PRODUCED BY B COMPANY | 27 | 6 |
| POLYIMIDE PRODUCED BY C COMPANY | 0.7 | <1 |
| MOLD RESIN PRODUCED BY D COMPANY | 2.0 | <1 |

(unit: ppm)

PACKAGING METHOD FOR FLIP-CHIP TYPE SEMICONDUCTOR DEVICE

BACKGROUND OF THE INVENTION

1. Field of the Invention

The present invention relates to a packaging method for a flip-chip type semiconductor device, and more particularly to a method of connecting the electrodes of a semiconductor chip to a printed circuit board by soldering.

2. Description of the Related Art

A flip-chip type semiconductor device in which a plurality of solder bump electrodes formed on the surface of semiconductor chips are connected directly to a wiring pattern of a circuit board is broadly in use in the LSI field for the reasons that it permits high density packaging and enables one to obtain high bonding reliability. The technology for this device is described in, for example, an article by Sato et al. entitled "Micro-solder Bonding Technology for IC-LSI", Processings of the Japan institute of Metals, Vol. 23, No. 12 (1984), pp. 1004–1013.

In accordance with the prior art, solder bonding is carried out by applying soldering flux to a circuit board with a wiring pattern formed thereon, positioning the solder bump electrodes of semiconductor chips to the pads of the wiring pattern and binding them with soldering flux, then melting the solder (referred to reflowing hereinafter) by heating. In this process, the soldering flux has an important action of temporarily binding the positioned semiconductor chips by virtue of its bonding power, in addition to the action of smoothly carrying out reflowing.

On the other hand, accompanying the increase in the level of integration of LSIs, heat dissipation from the semiconductor chips of the flip-chip type semiconductor device has become an important technical issue, which necessitates the provision of a heat dissipating means on the rear surface of the semiconductor chips. As one of such heat dissipation methods Rao R. Tummala published an article entitled "Advance Packaging Technologies in U.S.—An Overview", IMC 1988 Proceedings, Tokyo, May 25-27, 1988, pp. 12–17 in which he proposed a structure wherein a cooling piston is pressed mechanically against the rear surface of one semiconductor chip by means of a spring. In addition, R. Darveaux, et al. propose a method in which a heat sink is commonly fitted to the rear surfaces of a plurality of semiconductor chips via a piece of indium with certain thickness in an article entitled "Thermal/Stress Analysis of a Multichip Package Design", Proceedings of the 39th Electronic Components Conference, May 1989, pp. 668–671.

However, the conventional method of temporarily binding semiconductor chips using soldering flux generates problems related to the bonding reliability and the yield due to the fact that many harmful impurities contained in the soldering flux are brought into contact with the front surface of the semiconductor chips. In particular, in view also of the circumstance that the reduction of intrusion of harmful impurities into various materials becomes severe in proportion to the advance of the level of integration and fine geometry of semiconductor chips, it is necessary to exclude soldering flux from the fabrication process.

Moreover, according to the above-mentioned conventional method the rear surfaces of various semiconductor chips, after reflow, do not find themselves located on the same plane, and the height deviation among the rear surfaces of the plurality of semiconductor chips becomes large. This is the reason why the cooling means with long heat dissipation path and complicated structure has to be arranged for each of the semiconductor chips as mentioned above. On the other hand, the aforementioned method of commonly fitting a heat sink by canceling the difference in the height among the plurality of semiconductor chips by forming the indium piece to have a large thickness (500–800 $\mu$m, for example) is not desirable because it results in the increase in the thermal resistance up to the location of the heat sink.

SUMMARY OF THE INVENTION

It is therefore an object of this invention to provide a packaging method for a flip-chip type semiconductor device which connects solder bump electrodes of semiconductor chips to pads of the wiring pattern of a printed circuit board without generating problems related to the bonding reliability and the yield.

It is another object of this invention to provide a packaging method for a flip-chip type semiconductor device which connects in a simple way a heat sink commonly to the rear surfaces of a plurality of semiconductor chips by reducing the thermal resistance.

A feature of this invention resides in that the method of packaging a flip-chip type semiconductor device includes a process of temporarily binding the rear surface side of a plurality of semiconductor chips that have solder bump electrodes formed on the front surface side to the respective predetermined locations on the flat surface of a block by means of wax of, for example, film thickness 5–10 $\mu$m as an adhesive, and a process of preparing a circuit board having a wiring pattern with a plurality of pads formed on the surface thereof, whereby the plurality of the semiconductor chips are bonded in a lump to the circuit board by positioning the block and the circuit board by placing the flat surface of the block so as to face the surface of the circuit board, bringing the solder bump electrodes and the pads into contact without the intermediary of soldering flux by letting them approach with each other, and bonding the solder bump electrodes to the pads by causing the solder of the solder bump electrodes reflow. In the last process of the reflow of the solder is desirable to be carried out in an atmosphere of a halogen gas.

Further, it can be arranged such that the solder bump electrode consists of a high melting point solder part and a low melting point solder part, the heating process has a first heat treatment process at a first temperature and a second heat treatment process at a second temperature higher than the first temperature, whereby local bonding is performed by melting only the low melting point solder part by the first heat treatment process, removing the block from the rear surfaces of the semiconductor chips, then carrying out the final bonding by melting the high melting point solder part and the low melting point solder part in the second heat treatment in the state where the rear surfaces of the semiconductor chips are placed on a flat surface of a jig. In this case, it is desirable to carry out electrical tests of the circuit board having the semiconductor chips locally bonded, between the first heat treatment process and the second heat treatment process.

As in the above, according to this invention, the temporary binding of the semiconductor chips is carried out on the rear surface side of the semiconductor chips and hence there does not exist soldering flux on the front surface side of the semiconductor chips. Therefore, there will occur absolutely no generation of problems related to the bonding reliability and the yield caused by the many harmful impurities contained in the soldering flux.

Moreover, according to this invention, reflow is carried out by bonding the rear surface side of a plurality of semiconductor chips to the flat surface of the block or the flat surfaces of the block and the jig, so the difference in the height among the rear surfaces of the plurality of semiconductor chips after the reflow is almost negligibly small, and all of the rear surfaces are located on the substantially same plane. Accordingly, it is possible to connect the heat sink commonly to the rear surfaces of the plurality of semiconductor chips with reduced thermal resistance by the use of a thin film of such material as thermal grease as the adhesive.

Furthermore, the positioning of the block and the circuit board may be done by forming positioning through holes in the block and a positioning pattern on the circuit board, and observing the pattern via the through holes. In this case, the block may be constructed of a silicon wafer of (100) surface, and form the positioning through holes by selective anisotropic etching of the silicon wafer.

BRIEF DESCRIPTION OF THE DRAWINGS

The above-mentioned and other objects, features and advantages of this invention will become apparent by reference to the following detailed description of the invention taken in conjunction with the accompanying drawings, wherein:

FIG. 8A to FIG. 8F are sectional views as arranged in the order of the processes for showing a second embodiment of the packaging method according to the invention, wherein FIG. 8E is a plan view and all of the rest are sectional views.

DESCRIPTION OF THE PRIOR ART

Figure 1A:
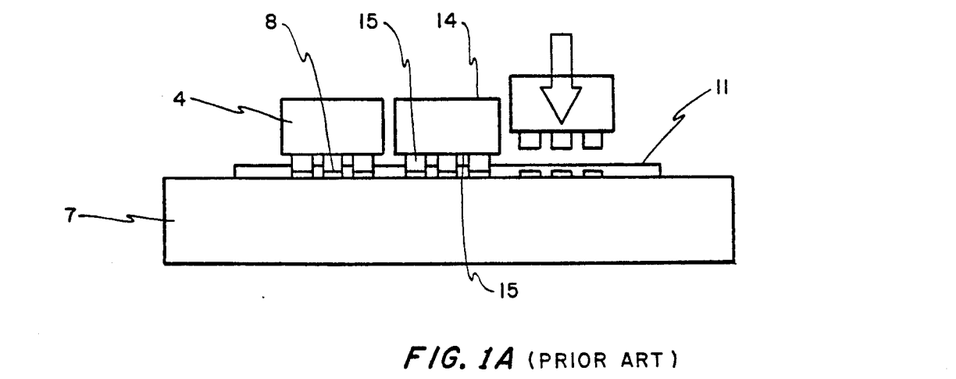
FIG. 1A and FIG. 1B are sectional views as arranged in the order of the processes for showing the conventional packaging method of a flip-chip type semiconductor device.
Figure 1B:
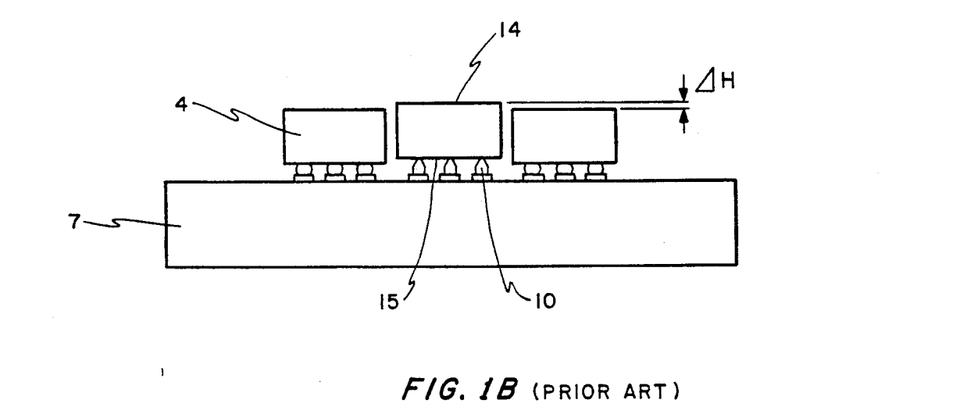

First, referring FIG. 1, the packaging method according to the prior art will be described. Liquid rosin soldering flux 11 is applied to a circuit board 7 having a wiring pattern formed thereon, and a semiconductor chip 4 with elements such as transistors and a wiring pattern formed on its surface 15 side is pressed face-down in the direction of the arrow to align the solder bump electrodes on the surface 15 to the pads 8 of the wiring pattern and to bind them temporarily by means of the soldering flux 11 (FIG. 1A). Then, the bonding of the electrodes and the pads is carried out through formation of solder balls 10 by reflow of the solder (FIG. 1B).

Figure 2:
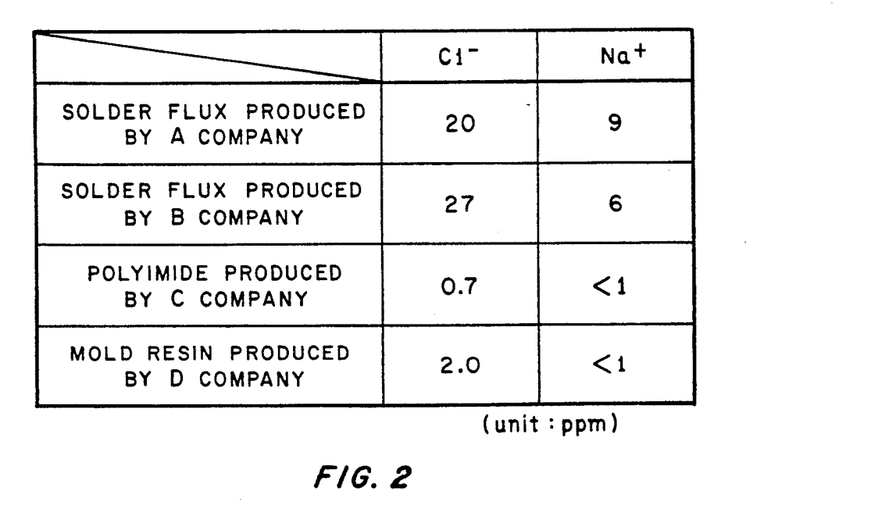
FIG. 2 is an impurity analysis table for describing the issues of the prior art.

The result of analysis for the contents of $Cl^-$ and $Na^+$ which are impurities harmful to the semiconductor chip are summarized in FIG. 2. As is clear from the figure, soldering flux contains far more amount of harmful impurities compared with polyimide that constitutes the semiconductor chip or molded resin which is the packaging material. Therefore, the bonding reliability and the yield are deteriorated in the above-mentioned method in which the surface 15 side where elements are formed is brought into contact with the soldering flux 11.

Moreover, in the above-mentioned method the deviation ($\Delta H$) of the height of the rear surface 14 of each semiconductor chip 4 becomes large. For example, when the total of nine semiconductor chips 4, namely, three in a row by three in a column, are mounted on the same circuit board and bonded with solder, the difference $\Delta H$ between the maximum and the minimum heights among the rear surfaces 14 of the semiconductor chips amounts to as large of value as 100–150 $\mu m$. Consequently, it is difficult to mount a heat sink commonly with reduced thermal resistance on the rear surface of a plurality of semiconductor chips.

DETAILED DESCRIPTION OF THE PREFERRED EMBODIMENTS

Referring to FIG. 3, the first embodiment of the packaging method of the invention will be described.

Figure 3A:
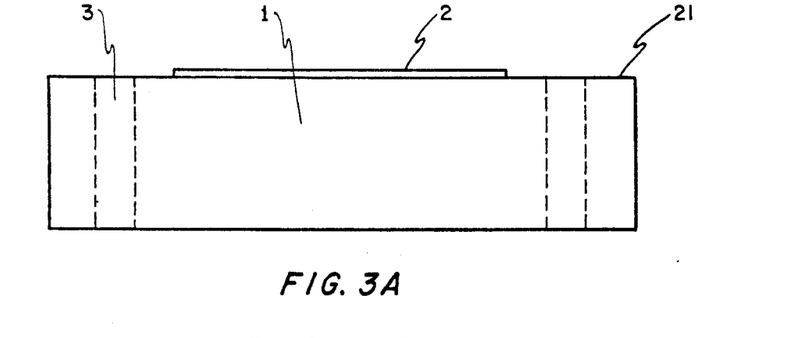
FIG. 3A to FIG. 3E are sectional views as arranged in the order of the processes for showing a first embodiment of the packaging method according to the invention.

First, as shown in FIG. 3A, wax 2 soluble to such a solvent as alcohol is applied to a thickness of 5–10 $\mu m$ to a flat finished surface 21 of a piece of stainless steel of square shape, with side length of 40–100 mm and thickness of 5 mm. At each of four places in the periphery of the block 1 there is formed a through hole 3 which is to be used later for positioning with respect to the circuit board.

Figure 3B:
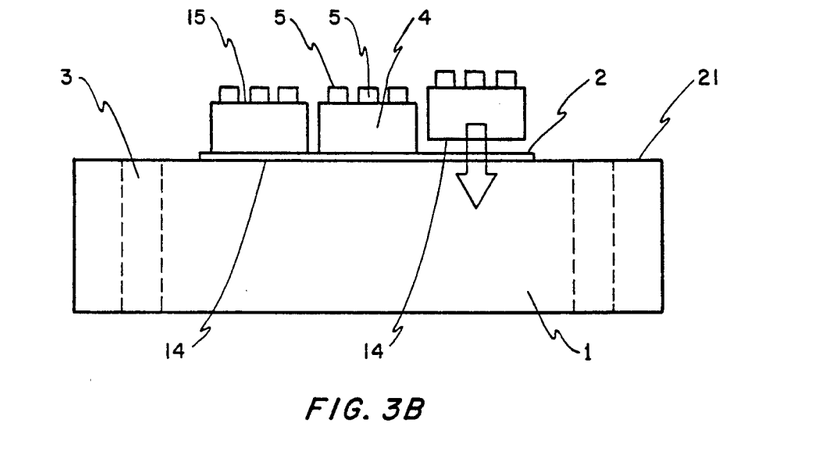

Next, as shown in FIG. 3B, a plurality of semiconductor chips 4, having solder bump electrodes 5 formed on the front surface 15 side where semiconductor elements, wirings and the like are mounted, are fixed by bonding with wax 2 at predetermined locations of the flat surface 21 of the block 1 by moving the chips with the rear surface 14 side facing downward. The solder bump electrode 5 of this embodiment is formed by solder plating a lead-tin alloy into a shape with square cross-section of side length 100–200 $\mu m$ and height 50–150 $\mu m$.

Figure 3C:
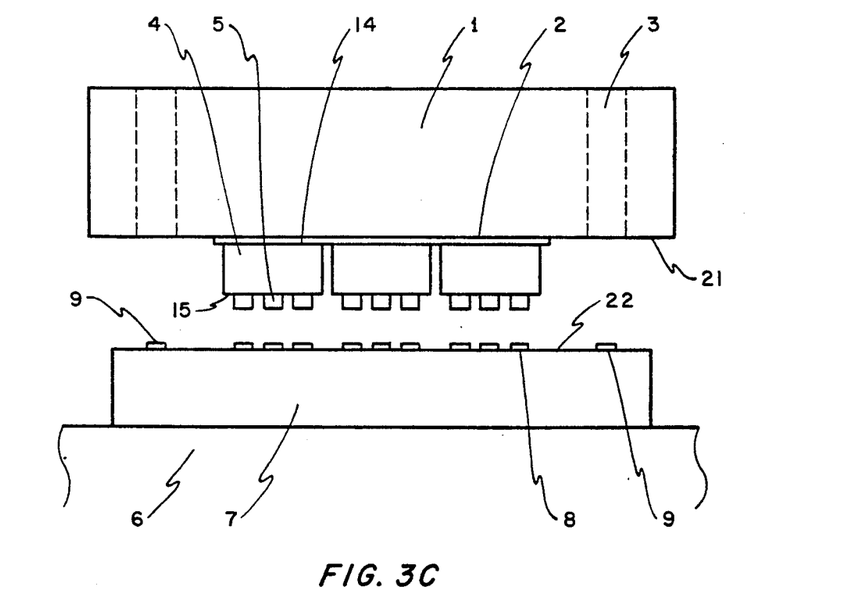

Next, as shown in FIG. 3C, the circuit board 7 is placed on stage 6 of the bonder. The circuit board 7 consists of a piece of silicon with square cross-section of side 30–100 mm and thickness 0.5–2.0 mm. A multilayer interconnection pattern consisting of a polyimide film and a metallic film of copper, gold, aluminum or the like is formed on the surface 22 of the board 7 and bonding pads 8 are formed connected to the pattern. The plane area of the bonding pad 8 has a size marginally larger than the plane area of the solder bump electrode, and it is formed on the surface 22 to a film thickness of 5–6 $\mu m$ by copper plating at the same time as the alignment marks 9 are formed. Then, the smooth surface 21 of the block 1 and the surface 22 of the circuit board 7 are placed opposing to each other, and the block 1 and the circuit board 7 are positioned by viewing the alignment marks 9 via the through holes 3 by a microscope.

Figure 3D:
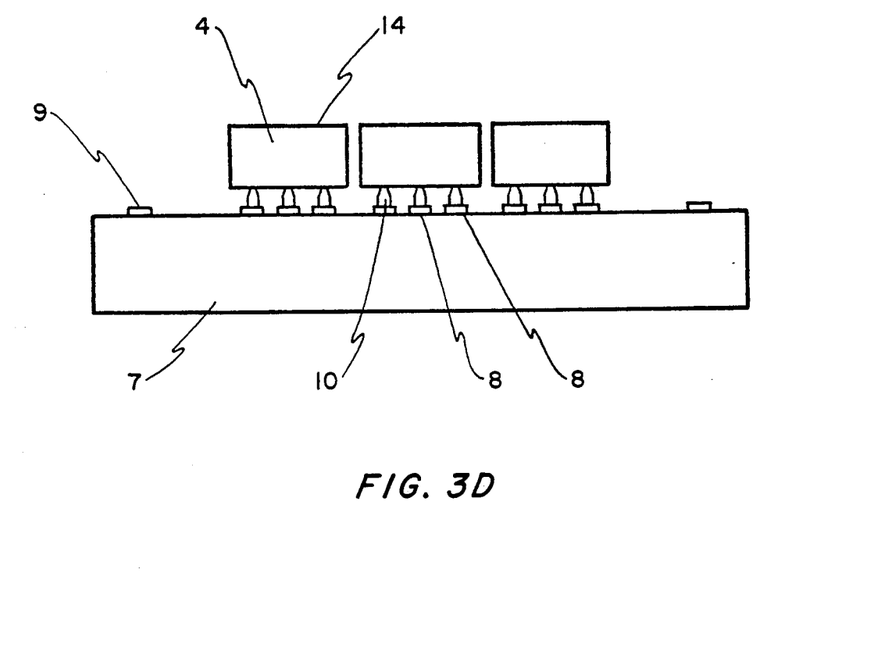

Following that, a plurality of solder bump electrodes 5 and the plurality of pads 8 are brought into contact by lowering the block 1 vertically downward. Since there is not involved soldering flux in this invention, solder reflow is carried out at a temperature in the range of 200°–300° C. in a heat treatment furnace of an inert gas containing a halogen gas in order to realize smooth reflow. The solder bumps 5 are converted to solder balls 10 due to surface tension when they are melted, whereby the bump electrodes are bonded to the pads. After cooling, the block 1 is detached from the rear surfaces 14 of the plurality of semiconductor chips 4 by washing and removing the adhesive 2 with an alcoholic solvent (FIG. 3D).

Regarding the topic of solder reflow itself in a halogen gas atmosphere it is disclosed by P. A. Moskowitz, et al. in an article entitled "Thermal Dry Process Soldering", J. Vac. Sci. Technol., A4(3), May/June 1986, pp. 838–840.

Figure 3E:
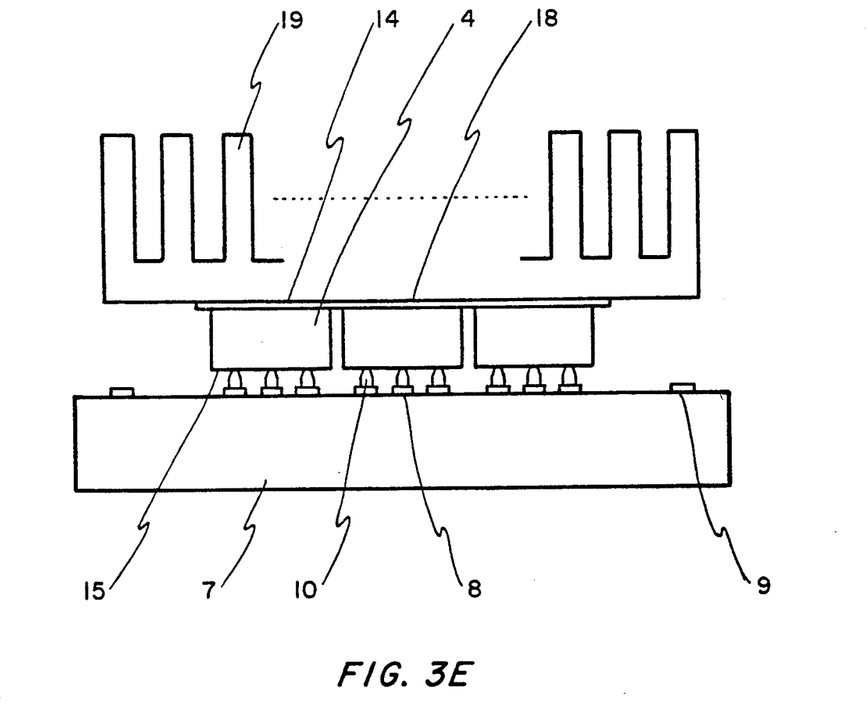

Next, as shown in FIG. 3E, a heat sink 19 is fitted to the exposed rear surfaces of the semiconductor chips via thermal grease 18, such as a highly heat conductive silicone (elastomer type). According to this embodiment, the deviation ($\Delta H$) of the height of the rear surfaces 14 of the semiconductor chips 4 becomes small by the presence of the flat surface 21 of the block 1. For example, when a total of nine, namely, three in a row by three in a column, semiconductor chips are mounted and bonded by soldering on the identical circuit board 7, it is possible to confine the difference $\Delta H$ between the maximum and the minimum heights of the rear surfaces of the semiconductor chips to a range of 5 to 10 $\mu$m. Accordingly, the thickness of thermal grease 18 can be made as thin as 10–70 $\mu$m and the thermal resistance between the rear surfaces of the semiconductor chips and the heat sink can be made low, so it is possible to fully exhibit the high speed and high output performance of the semiconductor chips. Thermal grease in this case acts as a heat conducting material as well as an adhesive. In order to increase the adhesive strength it is desirable to provide also a mechanical fixing means such as screws and pins at some appropriate places that are not explicity indicated in the figure.

Moreover, in sealing the circuit board and the semiconductor chips into a package, it is possible to form a heat dissipation system of low thermal resistance by thermally connecting the package to a package cap made of high heat conducting material via thermal grease since the rear surfaces of a plurality of semiconductor chips are in flat state.

Figure 4A:
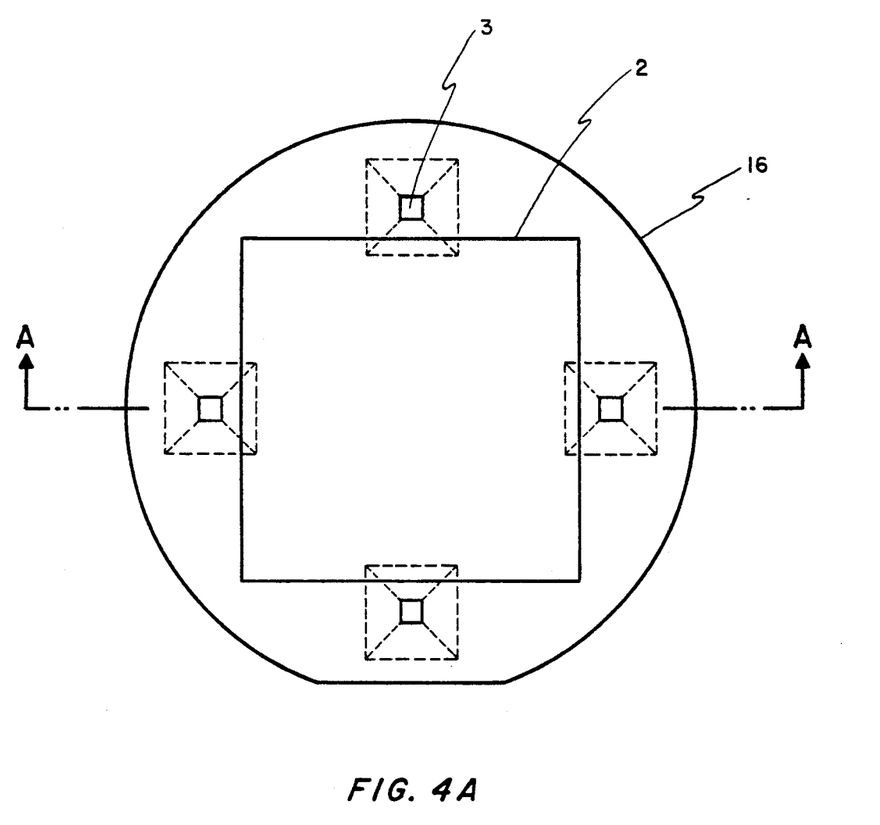
FIG. 4A is a plan view showing the case when block 1 in FIG. 3 is constructed of a silicon wafer.
Figure 4B:
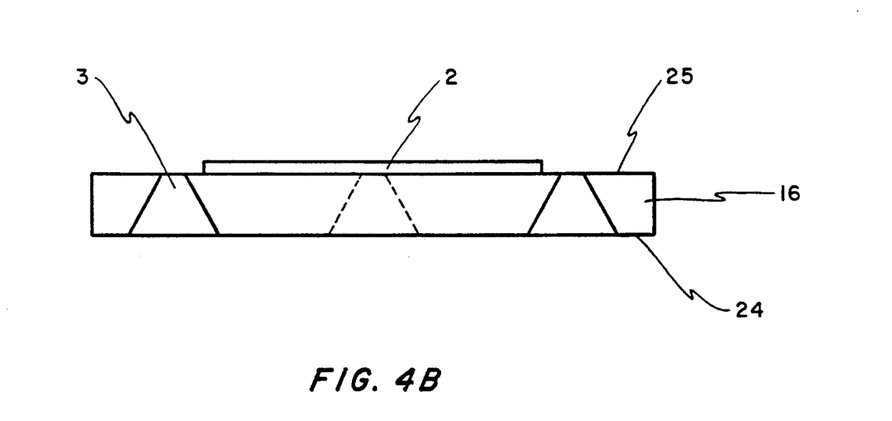
FIG. 4B is a sectional view when the block in FIG. 4A is cut along the line A—A' and seen in the direction of the arrows.

FIG. 4A and FIG. 4B are a plan view and a sectional view, respectively, when the block 1 in FIG. 3 is made of a silicon wafer. On the rear surface 24 of a silicon wafer 16 of (100) crystal face with 4 inch diameter and 400 $\mu$m thickness, a silicon dioxide film (not shown) is formed as a mask material by photolithography, and four pieces of through holes 3 are formed by anisotropic etching. As shown in FIG. 4B, the structure of the through hole 3 has sloped surfaces stopped by the (111) face characteristic of anisotropic etching. The hole has a larger size on the rear surface 24 side, and is tapered toward the front surface 25 side where it has the shape of a square of 3 $\mu$m side.

According to the present method, it is possible to form through holes for alignment with respect to the circuit board 7 since the photolithography technique and the etching technique used in the manufacture of semiconductor wafers can be employed as they are.

Figure 5:
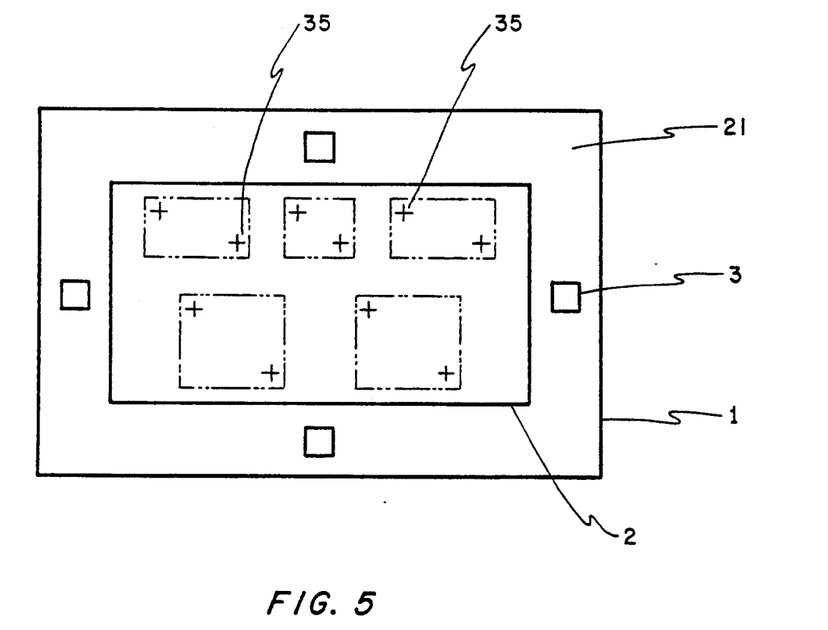
FIG. 5 is a plan view showing an example of the block.

FIG. 5 is a plan view showing the block 1 in FIG. 3 made of stainless steel in which the semiconductor chips are to be mounted and bonded at locations indicated by the lines with alternate long and two short dashes. At each of these locations a pair of cross-shaped alignment marks 35 are notched on the front surface 21. On the other hand, alignment marks are formed on the front surfaces of the semiconductor chips at the time of forming wiring patterns on the front surface side. Since these alignment marks on the front surfaces of the semiconductor chips need be detected from the rear surface side, infrared rays are employed for the alignment.

Figure 6:
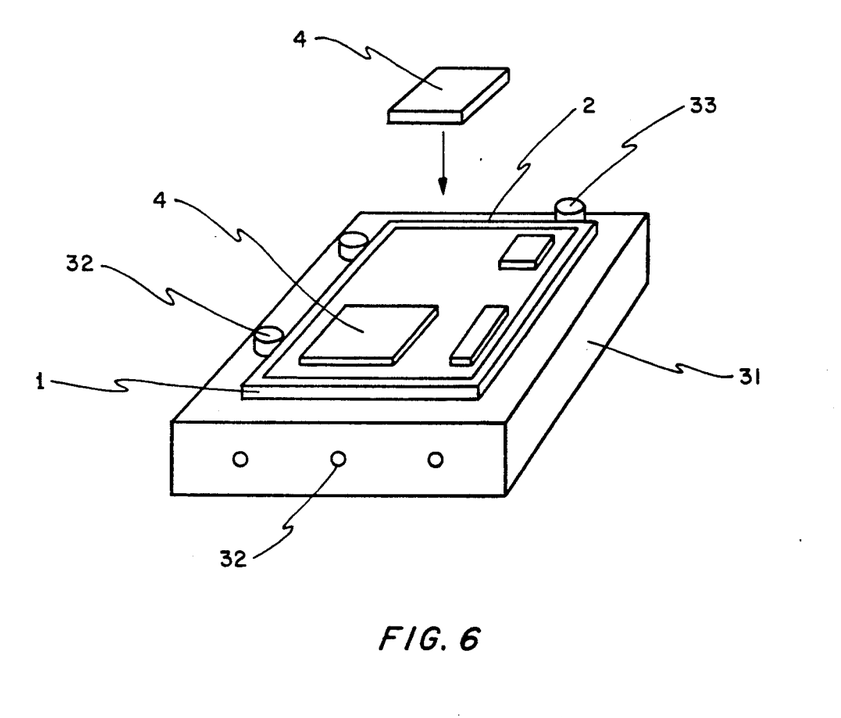
FIG. 6 is a perspective view showing the state of mounting semiconductor chips on the block.

FIG. 6 is a perspective view showing the state of mounting the semiconductor chips 4 on the block 1. The block 1 is mounted on a predetermined position of a base table 31 by the help of guide pins 33, fixed there by evacuation through vacuum holes 32, and the semiconductor chips 4 are mounted and bonded one by one on the block 1.

Figure 7A:
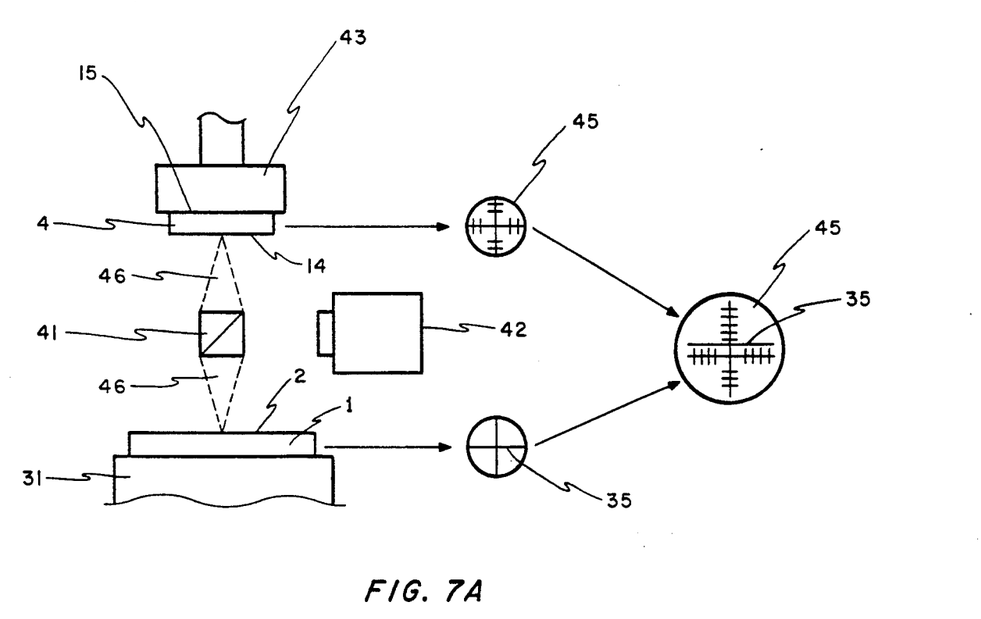
FIGS. 7A, 7B are schematic views showing open and closed positions for illustrating an alignment method of the semiconductor chip to the block.
Figure 7B:
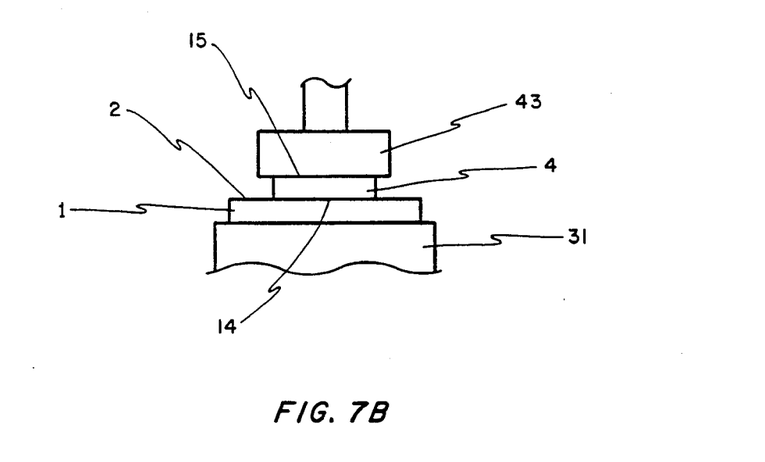

Referring to FIG. 7, the method of aligning the semiconductor chips to the block will be described. As shown in FIG. 7A, a half mirror 41 is placed between the block 1 vacuum sucked to the base table 31 and the semiconductor chip 4 the front surface 15 side thereof is vacuum sucked to a collet 43 movable in X direction, Y direction and $\theta$ direction. An alignment mark 45 on the semiconductor chip 4 and the alignment mark 35 on the block 1 are viewed overlapped through a half mirror 41 of a CCD camera 42 that uses infrared rays 46, and are brought to precise overlapping by adjusting the motion of the collet 43 in the X direction, Y direction and $\theta$ direction. Then, the half mirror is withdrawn sideways and the collet 43 is lowered in vertical direction to bring the semiconductor chip into contact with the block (FIG. 7B), and the vacuum suction of the semiconductor chip to the collet is released. Next, another semiconductor chip is vacuum sucked to the collet and a similar operation is repeated.

Next, referring to FIG. 8, the second embodiment of the packaging method according to the invention will be described. Since identical symbols are assigned in FIG. 8 to components identical or similar to those in FIG. 3, further description on these components will be omitted.

Figure 8A:
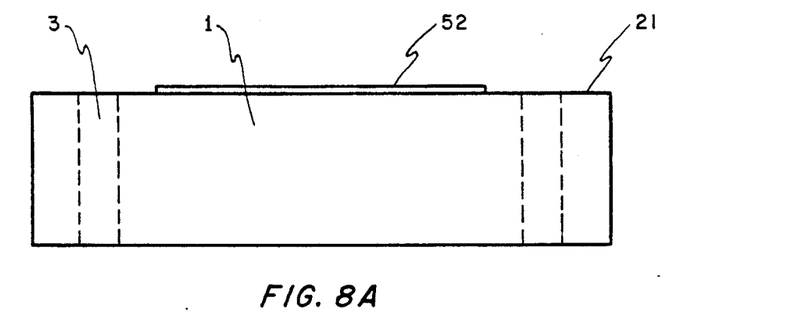

First, as shown in FIG. 8A, the smooth surface 21 of the block 1 is coated with wax 52 with melting point 100° C. to a thickness of 5–10 $\mu$m.

Figure 8B:
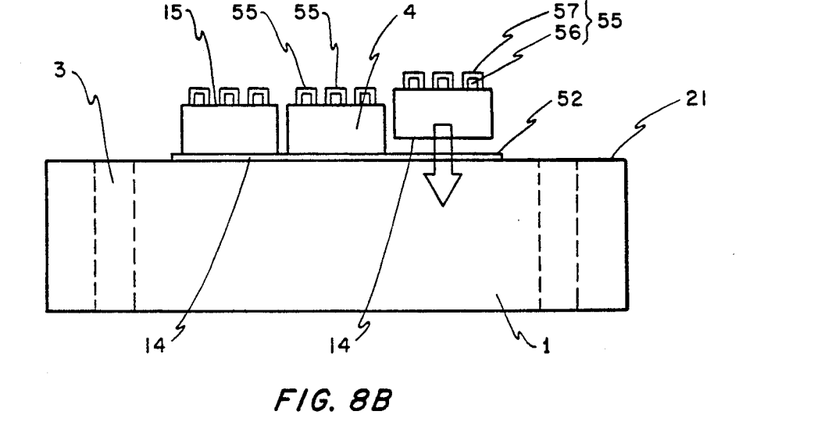

Next, as shown in FIG. 8B, the rear surface 14 side of the semiconductor chip 4 is bonded to a predetermined location on the smooth front surface of the block 1 with wax 52. A solder bump electrode 55 of this embodiment on the front surface 15 of the semiconductor chip 4 has a structure obtained by stacking low melting point solder 57 formed by solder plating on high melting point solder 56 formed by solder plating.

Figure 8C:
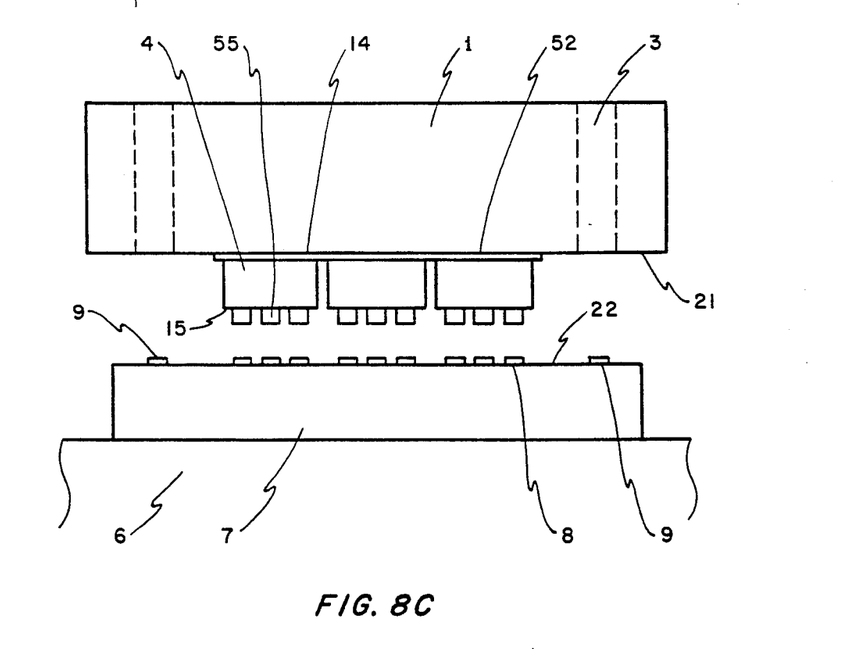

Next, as shown in FIG. 8C, a circuit board 7 is placed on a stage 6 of the bonder, the smooth front surface 21 of the block 1 and the front surface 22 of the circuit board 7 are arranged facing with each other, and the positioning of the block 1 to the circuit board 7 is carried out by viewing the alignment marks 9 via the through holes 3.

Figure 8D:
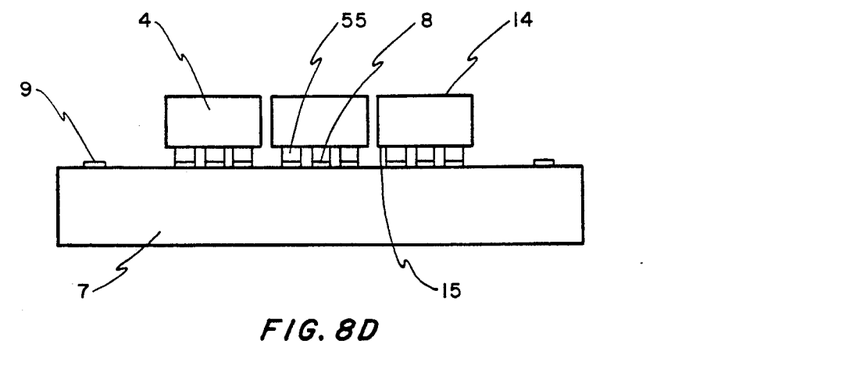

Next, as shown in FIG. 8D, a plurality of the bump electrodes 55 are respectively brought into contact with the plurality of pads 8 by vertically lowering the block 1. In this invention there is involved no soldering flux. A preliminary reflow is carried out in a heat treat furnace of an atmosphere of inert gas containing a halogen at a temperature of 110°–130° C. for 30 sec to 3 min to perform local bonding by melting only the low melting point solder 57 of the bump electrodes 55. At this time, wax 52 looses its adhesive power by foaming, permitting the removal of the block 1 from the rear surfaces 14 of the semiconductor chips 14.

Figure 8E:
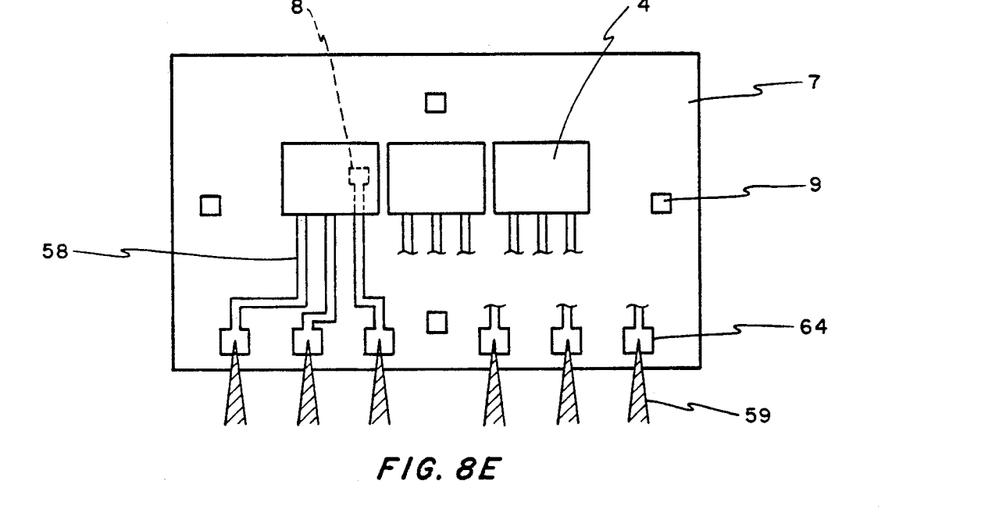

Next, as shown in FIG. 8E, electrical inspections of the circuit board with locally connected semiconductor chip is carried out by bringing an inspection probe 59 to a pad 64 for connecting an external terminal formed in the periphery of the circuit board 7, and is located at the tip of a wiring pattern 58 having a pad 8 connected to a solder bump electrode of the circuit board. Units which passed the electrical tests are sent to the next process, whereas among those which failed the tests but are reparable or correctable are subjected again to the electrical tests after necessary remedy and those passing the tests are sent to the next process.

Figure 8F:
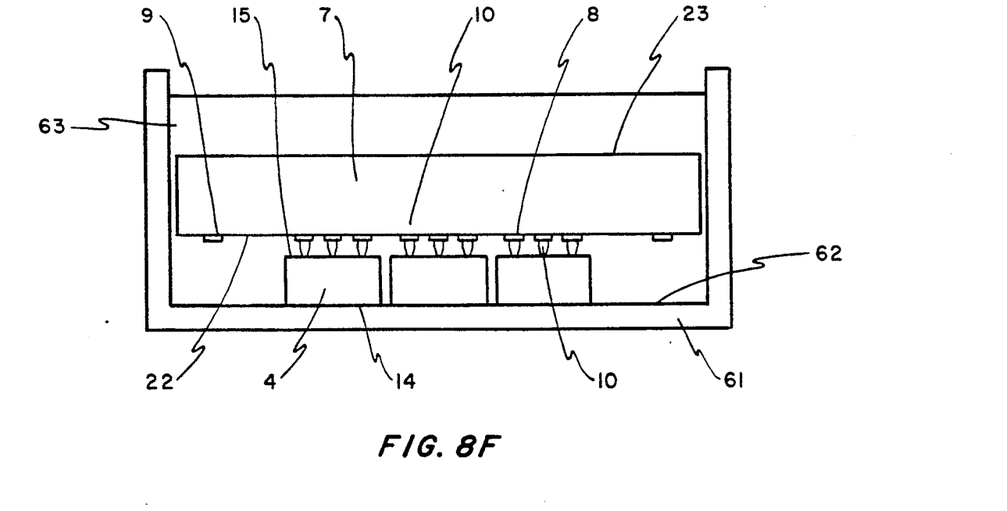

As shown in FIG. 8F, in the next process, the rear surfaces 14 of the semiconductor chips are placed, and are brought into contact with, flat bottom surface 62 of a jig 61 made of carbon, the rear surface 23 of the circuit board 7 is covered with a carbon lid 63, and the main reflow of solder is carried out in a heat treat furnace of inert gas atmosphere containing a halogen at a temperature range of 200° to 350° C. for 30 sec to 5 min. As a result of this, bonding of the semiconductor chips and the circuit board is achieved by the formation of solder balls 10 due to surface tension, by the melting of the high melting point solder 56 of the solder bump electrode 55 and the remelting of the low melting point solder 57 which was melted in the preliminary reflow and solidified on cooling.

Then, a heat sink means may be provided on the rear surface of the semiconductor chips as needed similar to the case of the first embodiment.

According to the second embodiment, the rear surfaces of the semiconductor chips are placed on the flat surface 21 of the block 1 at the time of the preliminary reflow, and are placed on the flat bottom surface 62 of the jig at the time of the main reflow. Therefore, the deviation ($\Delta H$) of the rear surface height among a plurality of the semiconductor chips can be made small as in the case of the first embodiment.

Although the invention has been described with reference to specific embodiments, this description is not meant to be construed in a limiting sense. Various modifications of the disclosed embodiments, as well as other embodiments of the invention, will become apparent to persons skilled in the art upon reference to the description of the invention. It is therefore contemplated that the appended claims will cover any modifications or embodiments within the scope of the invention.

What is claimed is:

1. A packaging method for a flip-chip type semiconductor device, said method comprising the steps of:
   temporarily binding with an adhesive a rear surface on each of a plurality of semiconductor chips at respective predetermined locations on a flat surface of a block, each of said semiconductor chips having a plurality of solder bump electrodes formed on a front surface thereof;
   preparing a printed circuit board having a plurality of pads formed on a front surface thereof;
   positioning the flat surface of said block to face the front surface of said printed circuit board, with said bump electrodes in contact with said pads, said solder bump electrodes on the block and said pads on said printed circuit board being in direct contact with each other without an intermediary of soldering flux; and
   heating and melting said solder bump electrodes of said semiconductor chips in order to connect said solder bump electrodes to said pads so that said plurality of semiconductor chips are bonded in a lump to said printed circuit board.

2. A packaging method for a semiconductor device as claimed in claim 1, wherein said step of heating and melting said solder bump electrodes is carried out in a halogen gas atmosphere.

3. A packaging method for a semiconductor device as claimed in claim 1, wherein said block has a plurality of through holes penetrating through it, and said printed circuit board further has a plurality of positioning marks formed on the front surface thereof, said block and said printed circuit board facing each other with said through holes aligned with said positioning marks, respectively.

4. A packaging method for a semiconductor device as claimed in claim 3, wherein said block is a silicon wafer of (100) face and said through holes is formed by anisotropic etching of the silicon wafer in a selective manner.

5. A packaging method for a semiconductor device as claimed in claim 1, wherein each of said solder bump electrodes has a high melting point solder and a low melting point solder formed over said high melting point solder, said step of melting having a first heat treatment process at a first temperature and a second heat treatment process at a temperature which is higher than the first temperature, said first heat treatment process melting only said low melting point solder and said second heat treatment process melting both said high melting point solder and said low melting point solder, removing said block from said semiconductor chips after said first heat treatment process and before said second heat treatment process, and said second heat treatment process being carried out with the rear surfaces of said semiconductor chips on a flat surface of a jig.

6. A packaging method for a semiconductor device as claimed in claim 5, and further the step of performing electrical tests on said printed circuit board having said semiconductor chip between said first heat treatment process and said second heat treatment process.

7. A packaging method for a semiconductor device as claimed in claim 1, wherein said adhesive is a wax applied to the flat surface of said block with a thickness of 5 to 10 $\mu$m.

8. A packaging method for a semiconductor device as claimed in claim 1, further comprising the steps of removing said block from said semiconductor chips after said solder bump electrodes are connected to said pads and mounting a heat sink in common on the rear surfaces of said semiconductor chips.

9. A packaging method for a semiconductor device as claimed in claim 8, wherein said heat sink is bonded to the rear surfaces of said semiconductor chips using a thermal grease with a film thickness in the range of 10 to 70 $\mu$m.

* * * * *